United States Patent [19]

Takayama

[11] 4,198,569
[45] Apr. 15, 1980

[54] ELECTRON BEAM EXPOSURE SYSTEM

[75] Inventor: Hisao Takayama, Yokohama, Japan

[73] Assignee: Nippon Aviotronics Company, Limited, Tokyo, Japan

[21] Appl. No.: 952,280

[22] Filed: Oct. 18, 1978

[30] Foreign Application Priority Data

Oct. 29, 1977 [JP] Japan .................. 52-130072

[51] Int. Cl.$^2$ .............................................. A61K 27/02
[52] U.S. Cl. ............................ 250/492 R; 250/492 A; 250/396 ML
[58] Field of Search ............... 250/311, 492 A, 492 R

[56] References Cited

U.S. PATENT DOCUMENTS

| | | | |
|---|---|---|---|
| 4,099,062 | 7/1978 | Kitcher | 250/492 A |
| 4,136,285 | 1/1979 | Anger | 250/492 A |

Primary Examiner—Harold A. Dixon
Attorney, Agent, or Firm—Oblon, Fisher, Spivak, McClelland & Maier

[57] ABSTRACT

The electron beam exposure system according to this invention has a mask with a pattern cut therein that comprises a plurality of sub-patterns that make up an exposed pattern to be formed on the substrate, a first deflecting means for having electron beams sequentially select sub-patterns in the mask, and a second deflecting means that, in synchronism with said first deflecting means, combines the sub-patterns in said mask irradiated with said electron beams to thereby form a complete image of said exposed pattern on said substrate. The system of this invention further comprises a third deflecting means which uses electron beams having a cross section adequately smaller than each sub-pattern in the mask and which has such electron beams scan the selected sub-patterns in the mask, and a fourth deflecting means for arraying and exposing a plurality of complete images of said exposed pattern on said substrate. Said second deflecting means combines the sub-patterns in the mask in synchronism with said first and third deflecting means.

12 Claims, 11 Drawing Figures

ELECTRON BEAM EXPOSURE SYSTEM

BACKGROUND OF THE INVENTION

This invention relates to an electron beam exposure system, and more particularly to an electron beam exposure system of electron projection type adapted for use in processing on an industrial scale of ultra large-scale integrated circuits (ultra LSIs), storage or operation cells using magnetic bubble devices, microwave transistors, photo-integrated circuits, etc.

A method is known of making a microminiature pattern on devices such as ICs by printing such pattern on a substrate (hereinafter referred to as a wafer) coated with a photosensitive agent (hereinafter referred to as a photoresist). Heretobefore, light has been typically used to print the pattern on the substrate. Such optical method however is not applicable to, for example, processing ultra LSIs that require a line width of 1 micron or less. Exposure method has therefore been developed using X-ray or electron beams of short wavelengths. One example of this exposure method is in electron beam writing system that prints a pattern on a wafer by scanning in any order the wafer with a single very narrow beam of electrons (a beam diameter, for example, of about 0.1 micron) as in a scanning type electron microscope. While this method has advantages of providing adequate resolution and allowing computer controlled scanning with electron beams, it has the disadvantage of requiring prolonged exposure time that prevents large-scale processing. The exposure time that depends on the scanning method or the kind of photoresist is typically at least several tens of minutes for a wafer 5 to 7 cm square. Therefore, the method is only applicable to the manufacture of an experimental product or a mask (which will be described hereinafter) that serves as a model of a pattern to be printed. A recent modification called the "rectangular beaming system" that uses an electron beam whose cross section is shaped by a fixed or adjustable aperture stop has the exposure time per wafer reduced to only a few minutes. But then the modified method gives lines as wide as at least 2 microns; in other words, it cannot offer a reduction in exposure time without sacrificing the line width. Another method that uses X-rays offers an advantage of relatively simple and less expensive equipment, but on the other hand, with a line width requirement of less than 1 micron, the method is not suitable for large-scale processing not only because of difficulties in the manufacture and registration of the mask mentioned above but also it takes as much exposure time as the electron beam writing system.

The electron beam exposure system of electron projection type of which this invention is an improvement employs a wide beam of electrons and causes it to transmit through a pattern cut in a mask of metal foil located on the way of its path. The electron beam which has its cross section as obtained immediately after passage through the cut pattern shaped to comply with said pattern is projected on the wafer to form an electronic optical image of the pattern thereon. Consequently, the amount of electron beams that can be utilized is very large as compared with the electron beam exposure system according to the afore-described electron beam writing system that uses a very narrow electron beam; hence, the exposure time for a wafer 5 to 7 cm square is reduced to only several tens of seconds. For this reason, the electron beam exposure system of electron projection type is considered basically suitable for mass production of very small circuit elements.

However, according to this type of electron beam exposure system that has an intended pattern cut in a metal foil mask, that portion of the mask which is enclosed by the pattern of a closed loop cannot be held in position. One method of solving this problem is to retain the whole mask on the electron paths by placing it on a screen made of extremely fine wires; this eliminates the possibility of a dotted image on the wafer by blurring. However, blurring to prevent the dotted image in turn makes it difficult to form an accurate image of the pattern on the wafer; secondly, stable retaining of separate portions of the mask on the wire screen is not so easy as desired; and thirdly, the wire screen scatters the electron beam, thus reducing the resolution and accuracy.

Alternatively, such looped patterns cut in the mask can be divided into more than one sub-pattern so that no single sub-pattern has a closed loop. For exposure, a set of such fragmentary patterns are combined together to form on the wafer a complete pattern that includes the looped portions. However, according to the conventional method of such "overlapping exposure system", different masks are used for different sub-patterns, thus resulting in a very low productivity because a great care need be used in replacement or registration of respective masks.

SUMMARY OF THE INVENTION

It is therefore one object of this invention to eliminate the defects of the prior art technique and provide an electron beam exposure system which is capable of processing many wafers on an industrial scale by overlapping exposure of patterns without mask replacement.

It is another object of this invention to provide an electron beam exposure system that achieves easy and fast overlapping exposure of patterns by irradiating the mask with electrons uniformly.

It is a further object of this invention to provide an electron exposure system that achieves easy and fast overlapping exposure of patterns without mask replacement while eliminating geometrical distortions and blurs due to aberrations of electron lenses.

It is still another object of this invention to provide an electron exposure system that achieves more efficient overlapping exposure of patterns without mask replacement by electronically providing a wafer with an array of a plurality of complete pattern images using a single mask.

It is a still further object of this invention to provide an electron beam exposure system that achieves easy and fast overlapping exposure of patterns without mask replacement by eliminating errors in overlapping procedure by means of imaging patterns with their overlapped portions crossing each other.

This invention provides an electron beam exposure system which includes an electron gun for emitting electron beams and electron lenses for focusing or spreading such electron beams and which irradiates a mask that has a pattern cut therein with said elctron beams to image the cut pattern on an electron sensitive substrate or a wafer to thereby form an exposed pattern on the substrate. According to the characteristic features of this invention, the cut pattern in the mask comprises a plurality of sub-patterns that make up the exposed pattern, and the electron beam exposure system further includes a first deflecting means for having the electron beams sequentially select sub-patterns in the mask and a second deflecting means for forming a complete image of the exposed pattern on the substrate by overlapping images of sub-patterns in the irradiated mask in synchronism with the first deflecting means. By further providing such electron beam exposure system with a third deflecting means that shapes the irradiating electron beams into relatively narrow beams that overlap each other and which has such beams scan the pattern in the mask, uniform irradiation of the mask can be achieved without extending the exposure time and with geometrical distortions or blurs due to aberrations of electron lenses eliminated. Further reduction in the manufacturing time of microminiature-circuit elements can be provided by additionally using a fourth deflecting means that electronically array and expose a plurality of complete pattern images on the wafer. The electron beam exposure system of this invention is particularly suitable for use in printing an image of a looped pattern on a wafer.

The electron beam exposure system of this invention will now be described in detail by reference to several of its embodiments illustrated in the accompanying drawings.

DETAILED DESCRIPTION OF THE PREFERRED EMBODIMENTS

Figure 1:
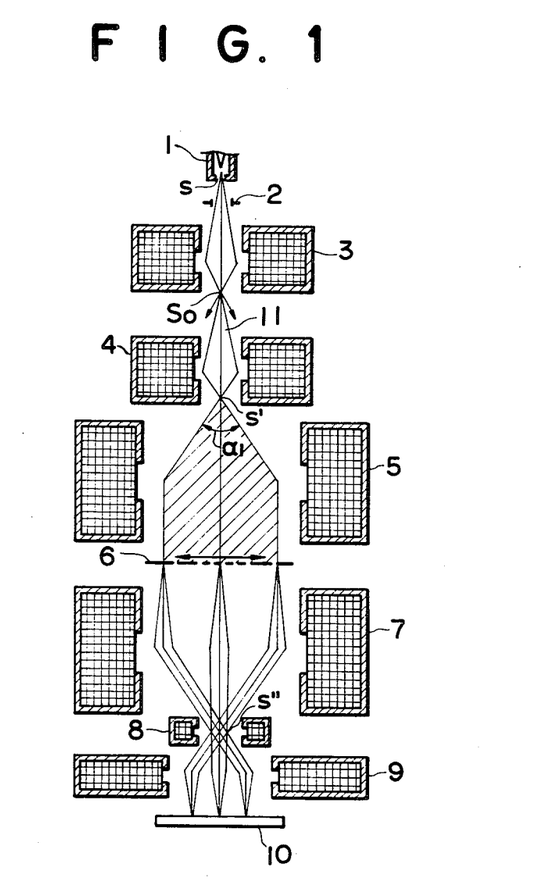
FIG. 1 is a schematic illustration of the operating theory of the conventional electron beam exposure system of electron projecting type.

First, reference is made to FIG. 1 that shows the operating theory of a typical conventional electron beam exposure system. At the top of the system is an electron source or electron gun 1 that emits electron beams. At the bottom of the system there is located a wafer 10 that is sensitive to electron beams. Between the electron gun 1 and wafer 10 is inserted a mask 6 of metal foil in which is cut a pattern. Along the paths of electron beams 11 are arrayed a group of electron lenses which focus or spread the electron beams 11 from the electron gun 1 so as to project the cut pattern onto the wafer 10. To prevent scattering of electron beams, the electron gun 1, wafer 10 and the electron lenses are mounted in a vacuum-tight tubular casing (which is not shown). The mask 6 and wafer 10 are inserted into the casing through vacuum-tight covers (not shown) to rest in specified positions.

Electron beams 11 emitting from a cross-over S just below the cathode of the electron gun 1 travel past between blanking deflection plates 2 and are focused by a first condenser electron lens 3 to form an image So. Then they are focused by a second condenser electron lens 4 to form an image S' at the second focal point, and finally focused by a third condenser electron lens 5 and first projector electron lens 7 to form an image S''. The image S' is on the focal point of the third condenser electron lens 5. Electron beams spreading from the position of the image S' at a spread angle $\alpha_1$ impinge on the mask 6 vertically as substantially parallel beams wide enough to cover the whole of the cut pattern in the mask 6. Therefore, the image S'' is on the focal point of the first projector electron lens 7. After passing through each point of the cut pattern in the mask 6 at an extremely small spread angle, the electron beams 11 are focused on the wafer 19 by the first projector electron lens 7 and a second projector electron lens 9, thereby forming on the wafer 10 a reduced electron projected image of the pattern cut in the mask 6. The reduction ratio 1/m of the optical projector system composed of the first projector electron lens 7 and the second projector electron lens 9 is typically, for example, 1/10. It is theoretically possible to make electron lenses by electrostatic means (electric lenses) or deflecting plates. However, for practical purposes, electrostatic means is not advantageously used in an electron beam exposure system because it has high degrees of aberrations and is susceptible to dust or stain of electrodes, and therefore, an electromagnetic means such as magnetic focusing coil or deflecting coil is commonly used. The blanking deflection plate 2 is slightly below the cathode of the electron gun 1 and used for switching electron beams 11 on and off. A registering deflection coil 8 is on the plane of the image S'' and used for fine adjustment in registration of the pattern to be projected on the wafer 10. The pattern cut in the mask is projected on the wafer and forms a chip. The wafer contains a plurality of identical chips having the pattern thus printed thereon.

To give a specific example of the exposure system shown in FIG. 1, the electron gun 1 is a triode gun using as the cathode a needle of lanthanum hexaboride (LaB$_6$) with a spherical tip 500 microns in diameter; electron beams 11 are accelerated at a voltage of 20 KV. The mask 6 measures 30×30 mm$^2$. If the reduction ratio is assumed to be 1/10, the area of the wafer 10 to be exposed (visual field) is 3×3 mm$^2$, the minimum line width 0.25 microns, the resolution limit 0.05 microns, and the required exposure time 0.1 second per chip (3×3 mm$^2$). If chips are closely arrayed on a 7.5 cm$^2$ wafer, the required exposure time per wafer comes at about 60 seconds, which is by far shorter than with other exposure systems. Unlike that of electron beam writing type that requires extreme narrowing of electron beams, the electron beam exposure system of electron projecting type substantially eliminates the use of aperture stops on the electron orbits and offers high exposure efficiency of beams (hereunder beam efficiency), thus resulting in a considerable reduction in the exposure time, as illustrated above.

Figure 2:
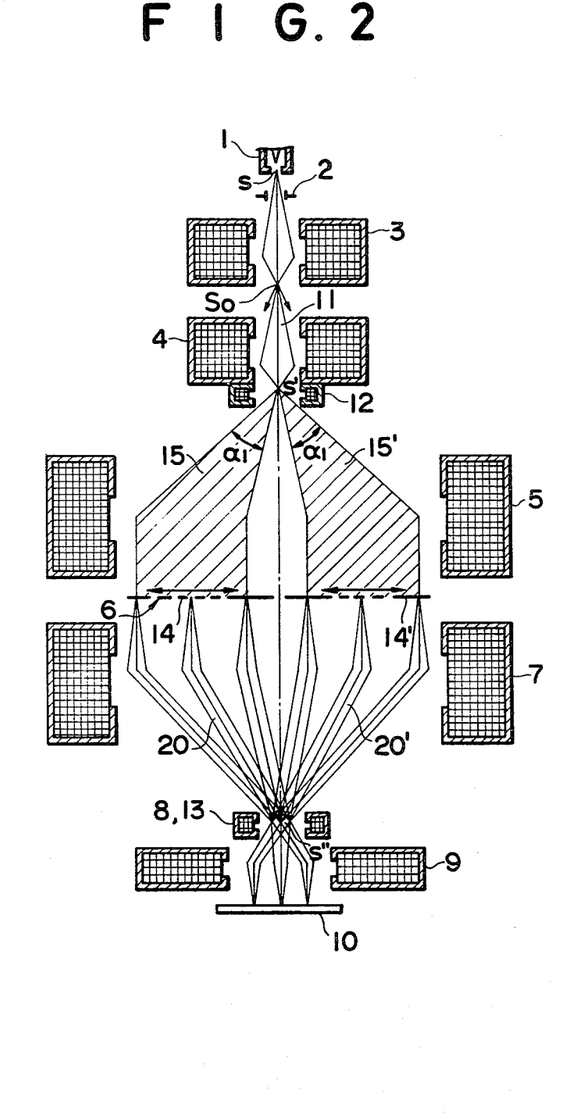
FIG. 2 illustrates the operating theory of the electron beam exposure system according to one embodiment of this invention.
Figure 3A:
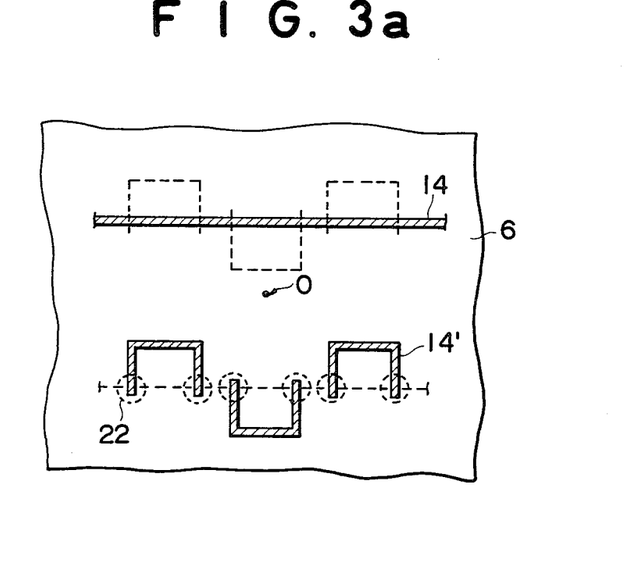
FIG. 3a is a plan view showing one embodiment of a mask having a pattern cut therein.
Figure 3B:
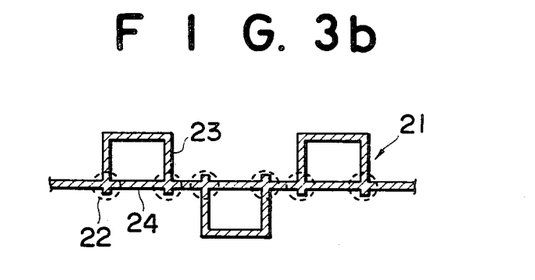
FIG. 3b shows the image of a pattern printed on the wafer.

FIG. 2 illustrates the operating theory of one embodiment of the electron beam exposure system of electron projecting type according to this invention. In the following embodiment and others illustrated in the accompanying drawings, the same numerals and symbols represent the same or equivalent parts. The structure of the electron beam exposure system illustrated in FIG. 2 differs from that of the system shown in FIG. 1 in the following points: a first deflecting coil 12 as a first deflecting means is located on the plane (or its neighborhood as throughout this specification) of an image S' of the crossover S of the electron gun 1; in addition to the registering deflection coil 8, a second deflecting coil 13 as a second deflecting means is located on the plane of an image S" of S'; and the third condenser electron lens 5, mask 6 and the first projector electron lens 7 each have a diameter substantially as large again as that of the counterparts shown in FIG. 1. FIG. 3a is a simplified embodiment of the mask 6. In the mask 6 are cut patterns 14, 14' (sub-patterns) divided into non-loops surrounding the center 0 of the mask substantially coinciding with the electron optical axis. In FIG. 2, the image of the center of deflection of the first deflecting coil 12 is formed on the plane of the image S". Therefore, the first deflecting coil 12 is so designed as to deflect on a time basis the electron beams 11 that have passed through the second condenser electron lens 4 so that they selectively irradiate the cut patterns 14 and 14'. For instance, the electron beams 11 are first deflected as shown by the numeral 15 to impinge on the pattern 14 in the mask 6, and then deflected as shown by the numeral 15' to impinge on the pattern 14' in the mask 6. While the sub-patterns 14, 14' cut in the mask 6 are alternately irradiated with the electron beams, electron beams 20, 20' passing through the cut patterns 14, 14' are deflected by the second deflecting coil 13 that synchronizes with but offsets the deflection caused by the first deflecting coil 12, thus achieving overlapping exposure through projecting on the wafer 10 a reduced complete image of an exposed pattern 21 having looped portions, as shown in FIG. 3b. Finely adjusting the quantity of deflection produced by the second deflecting coil 13 results in reasonably correct overlapping exposure. Further, any error in overlapping due to various causes can be eliminated by cutting sub-patterns in the mask so that the lines of one sub-pattern 23 cross with and protrude some distance from the line of another sub-pattern 24 that supplements the sub-pattern 23 to make loops at junctions, as shown by the dotted circle 22 in FIG. 3a, 3b. The advantage of such arrangement of sub-patterns is that an exposed image of the pattern has no broken loops. Since each sub-pattern cut in the mask 6 has no looped portions, the mask can easily be prepared and supported within an exposure system. As a further advantage of the embodiment shown in FIGS. 2 and 3a, 3b, a complete image of the pattern can be obtained without replacing masks in overlapping exposure.

Figure 4:
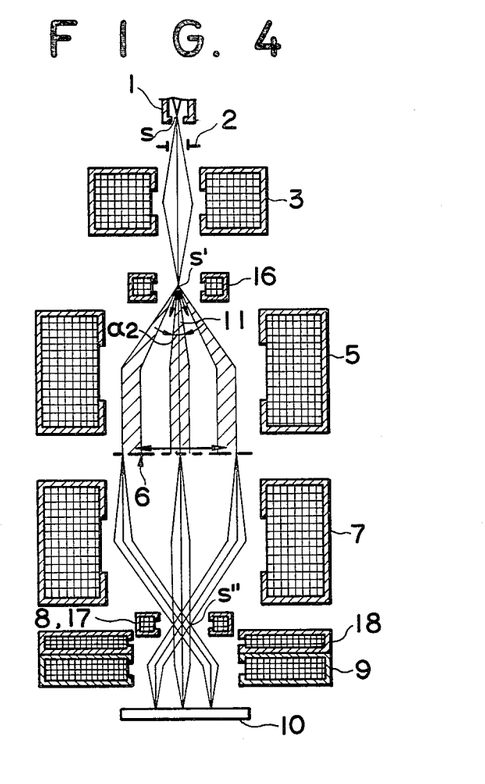
FIG. 4 illustrates the operating theory of the electron beam exposure system of the type that have electron beams scan the mask.

Referring to FIG. 4 that illustrates the operating theory of another embodiment of the electron beam exposure system according to this invention, the method of scanning the mask with electron beams 11 having a cross section sufficiently smaller than cut patterns and eliminating geometrical distortions and blurs due to aberrations of electron lenses. The structure of the electron beam exposure system shown in FIG. 4 differs from that of the system shown in FIG. 1 in the following points: the second condenser electron lens 4 of FIG. 1 is omitted, and so the first image of the crossover S of the electron gun 1 is focused by the first condenser electron lens 3 on the plane of an image S'; a third deflecting coil 16 as a third deflecting means is located on the plane of the image S'; and in addition to the registering deflection coil 8, an aberration correcting auxiliary deflection coil 17 as a fifth deflecting means is located on the plane of an image S" where the image S' is focused by the third condenser electron lens 5 and first projector electron lens 7. Represented by the numeral 18 is an aberration correcting auxiliary focusing coil. As described hereinbefore, the image S' is formed on the second imaging point of the crossover S in the embodiment shown in FIG. 1, but in the embodiment of FIG. 4, it is formed on the first imaging point of the crossover S, and therefore, electron beams spread from the plane of the image S' at an angle of $a_2$ in FIG. 4 which is by far smaller than $a_1$ at which they spread from S' in FIG. 1. Accordingly, the arrangement shown in FIG. 4 produces electron beams 11 whose diameter as measured on the mask 6 is by far smaller than the diameter of the cut pattern in the mask and which impinge on the mask as a spot of parallel beams. The function of the third deflecting coil 16 is to have the spot of electron beams 11 scan all parts of the cut pattern in the mask 6. The diameter of the electron beams employed in this embodiment is sufficiently smaller than the size of the cut pattern but not as small as in electron beam writing system, and therefore, scanning with lines not more than those used in television produces adequately overlapped lines. For this reason, scanning for one frame is sufficient to give uniform irradiation of all parts of the pattern. According to the conventional arrangement shown in FIG. 1, the cross-sectional dimensions of an electron beam are large enough to cover all parts of a pattern, and therefore, uniform current density for the cross section of an electron beam is required to achieve uniform irradiation of the pattern with electron beams. It has generally been found that the structure shown in FIG. 1 requires an irradiation uniformity of 10% or lower, which has been one of the limiting factors for design of electron guns. However, such limitation can be removed by the arrangement of FIG. 4 that accomplishes scanning to provide adequately overlapped scanning lines.

Figure 5:
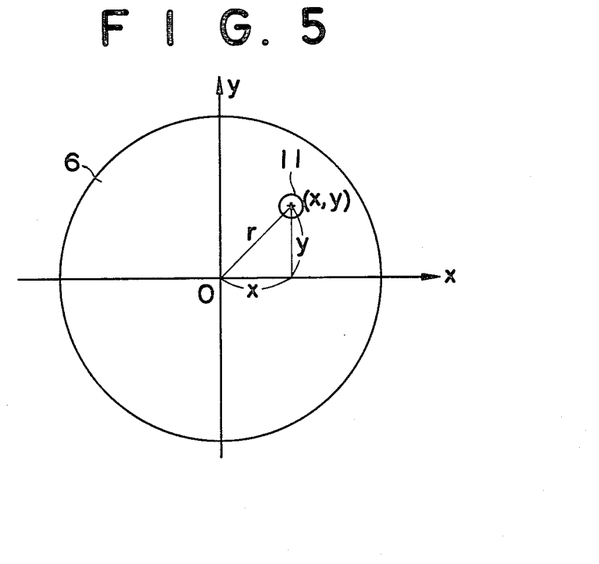
FIG. 5 defines by the co-ordinates (x, y) the position where electron beams impinge on the mask.
Figure 6:
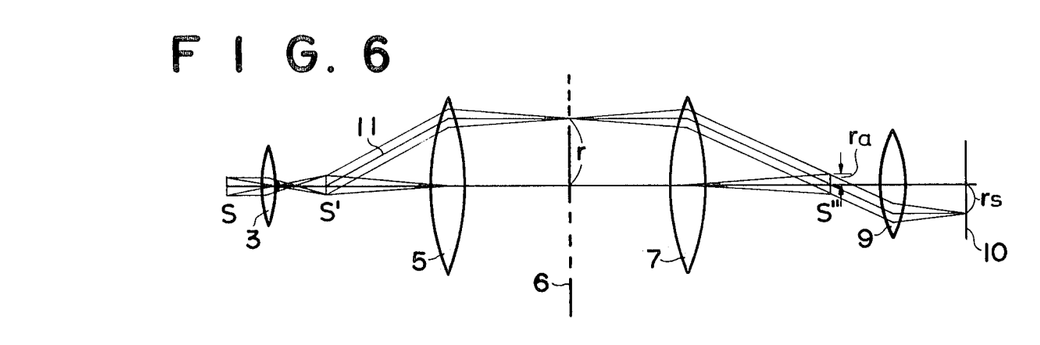
FIG. 6 is a schematic diagram of the electron optical system of the electron beam exposure system shown in FIG. 4.

As will be described hereinbelow, the electron beam exposure system that incorporates the arrangement shown in FIG. 4 is capable of correcting geometrical distortions or blurs caused by aberrations of electron lenses that constitute an electron projection system comprising the first projector electron lens 7 and second projector electron lens 9. Referring first to FIG. 5, let a point at which an electron beam 11 impinges on the mask 6 have the co-ordinates (x, y) with the electron optical axis at the origin, and its distance from the origin 0 be r; then $r=\sqrt{x^2+y^2}$. Electron beams 11 impinge vertically on the mask 6 as substantially parallel beams. Since the mask 6 is very thin, little scattering of electron beams 11 occur as they transmit through the cut pattern in the mask. FIG. 6 replaces the electron lens system of FIG. 4 with ordinary optical lens system and illustrate the positions of respective images. As FIG. 6 shows, the beam radius $r_a$ on the plane of an image S" is substantially equal to the radius of an image S' (hence, S) on the plane of S", and is by far smaller than r ($r_a << r$) with the exception of the value of r very close to the center of the mask 6. Let the polar co-ordinates of a point where an electron beam 11 coming out of a point (x, y)

on the mask 6 impinges on the projection surface or the wafer 10 be $(r_s, \theta_s)$ with the electron optical axis O at the origin, and the third order aberrations be $\Delta r_s$ and $r_s\Delta\theta_s$; then, with the above inequality $r_a < < r$ being taken into account, the following calculation formulae are obtained:

$$\Delta r_s \approx -A'r^3 \pm C_1 r^2 r_a \quad (1)$$

$$r_s\Delta\theta_s \approx -B'r^3 \pm C_2 rr_a \quad (2)$$

wherein the first term on the right side of each formula gives the size of a geometrical distortion, with the coefficients A' and B' being due to isotropic and anisotropic aberrations, respectively. The second term on the right side of each formula gives the size of a blur that determines the resolution, with the coefficients $C_1$ and $C_2$ being due to astigmatism and curvature of field, respectively. Let the amount of a blur given by the second term on the right side of formulae (1) and (2) be $d_1$, then the line width $d_s$ projected on the projection surface or the wafer 10 is given by the following calculation formula:

$$d_s = \sqrt{(d/m)^2 + d_1^2} \quad (3)$$

wherein d is the line width of a pattern cut in the mask 6 and 1/m is the reduction ratio of the electron projection system comprising the first projector electron lens 7 and second projector electron lens 9. As described before in connection with the structure of FIG. 4, the third deflecting coil 16 has electron beams 11 scan the mask 6, and therefore, the co-ordinates (x, y) or the radius r at time t can be directly determined. Therefore, any geometrical distortion and blur occurring in the electron projecting system can be corrected by constantly correcting aberrations using formulas (1) and (2) based on measured values of (x, y) or r.

Specific method of correcting geometrical distortions and blurs using the formulae (1) and (2) is now described. First, to correct geometrical distortions, the fifth aberration correcting auxiliary deflection coil 17 is provided on the plane of the image S" (or its neighborhood) as shown in FIG. 4. Let a point on the projection surface or the wafer 10 have the co-ordinates $(x_s, y_s)$ with the electron optical axis at the origin, and let the (x, y) axis and $(x_s, y_s)$ axis on the mask 6 be slanting by $\phi_s$, the angle of revolution of a paraxial electron orbit produced by the focusing magnetic field from the mask 6 to the wafer 10 (or the focusing magnetic field caused by the electron projecting system comprising the first projector electron lens 7 and the second projector electron lens 9); then, the degree of a geometrical distortion given by the first term on the right side of formulas (1) and (2) expressed by the following calculation formulae:

$$\Delta x_s = -(A'x - B'y)r^2 \quad (4)$$

$$\Delta y_s = -(A'y + B'x)r^2 \quad (5)$$

Therefore, assuming that $(x_a, y_a)$ axis, or the deflection axis of the aberration correcting auxiliary deflection coil 17 provided on the plane of S", is slanted from the (x, y) axis by $\phi_a$, the angle of rotation of a paraxial electron orbit produced by the focusing magnetic field from the mask 6 to the image S", a geometrical distortion in the pattern to be projected on the wafer 10 can be corrected by providing the aberration correcting auxiliary deflection coil 17 with aberration correcting deflection signals as expressed by the following formulae:

$$\Delta x_a = (Ax - By)(x^2 + y^2) \quad (6)$$

$$\Delta y_a = (Ay + Bx)(x^2 + y^2) \quad (7)$$

wherein $\Delta x_a = -K\Delta x_s$, $\Delta y_a = -K\Delta y_s$, $A = KA'$, and $B = KB'$, with K being a constant.

To correct blurs, on the other hand, the so-called lens effect of the first projector electron lens 7 or second projector electron lens 9 is either subjected to fine adjustment or a separate aberration correcting auxiliary focusing coil 18 is provided. To be more specific, as the second term on the right side of formulae (1) and (2) shows, the intensity of a blur $d_1$ is proportional to $r^2 \times r_a$; since $r_a$ is a given factor that depends on the design of an actual apparatus, the aberration that needs correction is proportional to $r^2$. Therefore, dynamic focusing used to compensate for the defocused edges of a spot that appear on the peripheral margins of a fluorescent screen of a cathode ray tube can be employed without any modification except that r is substituted for the quantity of deflection. To state more specifically, a blur can be corrected by either varying part of the current flowing through the coil of the first projector electron lens 7 or the second projector electron lens 9 to satisfy the following equation (8) or, if the separate aberration correcting auxiliary focusing coil 18 is provided as shown in FIG. 4, varying the current flowing through the coil to satisfy the equation $$\Delta i_a = C(x^2 + y^2) \quad (8).$$

The constants A, B and C in the formulae (6), (7) and (8) are inherent in an actual exposure system; therefore, with such constants given, the geometrical distortion and blur that depend on the point (x, y) where electron beams 11 impinge on the mask 6 can be minimized by correction based on these formulae.

Figure 7:
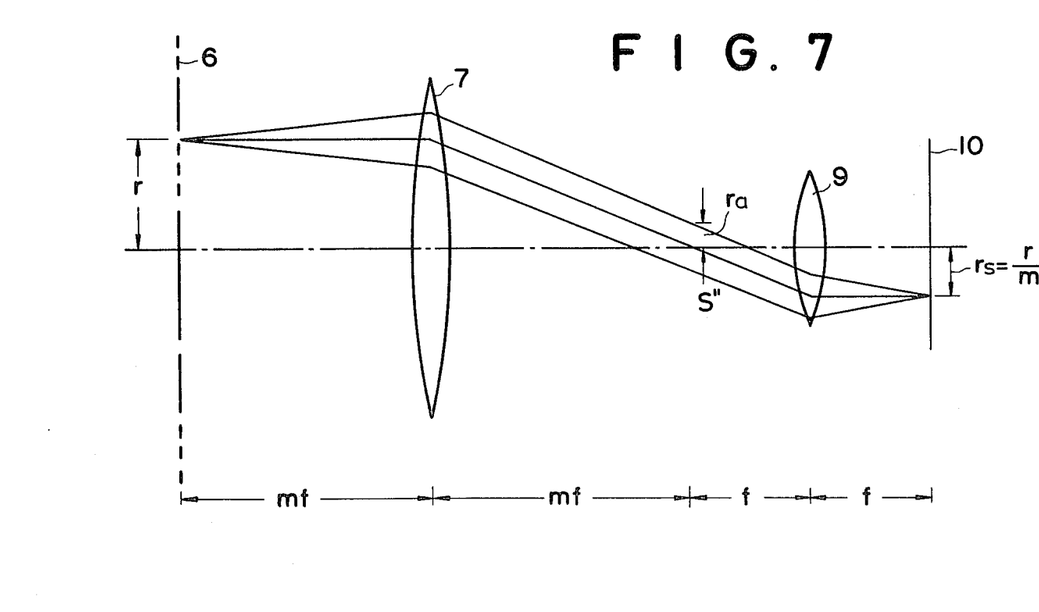
FIG. 7 is a schematic diagram of electron lenses of magnetic symmetrical doublet type.

FIG. 7 schematically illustrates electron lenses employed in the conventional electron beam exposure system of FIG. 1 when it is used as a magnetic symmetrical doublet type. In this embodiment, two electron lenses of the same type are used as the first projector electron lens 7 and the second projector electron lens 9. The two electron lenses are spaced from each other at a distance of (m+1)f, wherein mf is the focal length of the first projector electron lens 7 and f the focal length of the second projector electron lens 9. Since the mask 6 is located on the focal point of the first projector electron lens 7, and electron beams that impinge vertically on the mask 6 become parallel to each other on the plane of the mask, an image S" is formed on a plane at a distance of mf from the first projector electron lens 7 and electron beams coming out of a given point of the mask become parallel to each other on the plane of S". The position of the projection surface or the wafer 10 coincides with the focal point of the second projector electron lens 9. The reduction ratio 1/m of the electron projecting system that comprises the first and second projector electron lenses is $$r_s = r/m \quad (9).$$

The magnetic fields of these two electron lenses are opposite in direction, and thus, if $n_1 i_1$ is written for the ampere turns of the first projector electron lens 7 and $n_2i_2$ for the ampere turns of the second projector electron lens 9, the calculation formula $$n_2i_2 = -n_1i_1 \tag{10}$$

is obtained. Thus, with an ideal arrangement of an electron projection system of magnetic symmetrical doublet type, no geometrical distortion as expressed by the first term on the right side of the formulae (1) and (2) will occur throughout the entire visual field because they are offset by the two electron lenses. However, such ideal conditions are not necessarily satisfied by, for example, impregnated electron lenses such that the mask 6 and wafer 10 are contained in a focusing magnetic field, or if they are satisfied, the remaining fifth order aberration will be proportional to $r^3$, and therefore, the method of correcting geometrical distortions using the formulae (6) and (7) is considered still effective if the electron projection system is of magnetic symmetrical doublet type. On the other hand, it is generally found that even an ideal electron projection system of magnetic symmetrical doublet type is not capable of offsetting an (isotropic) astigmastism or an (isotropic) curvature of field, and therefore the second term on the right side of the formulae (1) and (2), hence the method of correcting blurs using the formula (8), still applies effectively to all types of electron projection system (including ideal magnetic symmetrical doublet type). If no correction of aberrations according to this invention is performed in the aforementioned specific embodiment of the electron exposure system of FIG. 1, a minimum geometrical distortion would be approximately 0.2 microns, and a minimum blur $d_1$ would be approximately 0.05 microns.

Figure 8:
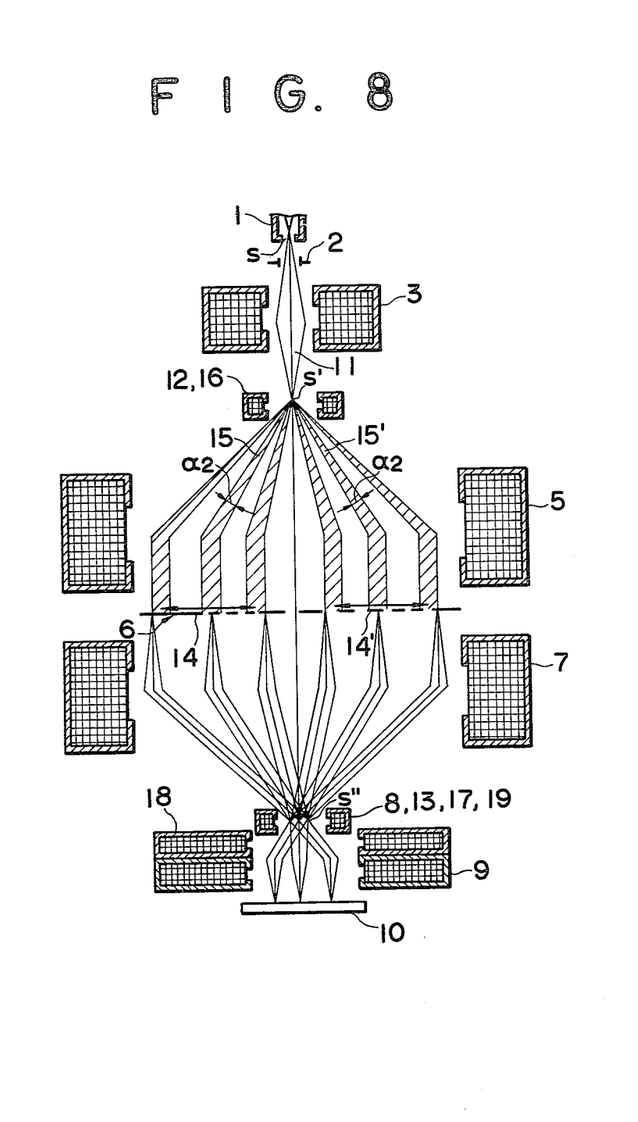
FIG. 8 illustrates the operating theory of the electron beam exposure system according to another embodiment of this invention.
Figure 9:
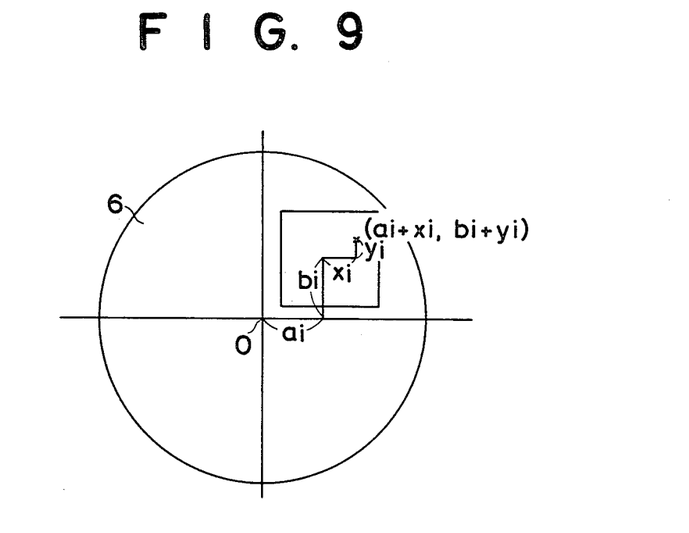
FIG. 9 defines by the co-ordinates (x, y) the position where electron beams impinge on the mask used in the apparatus shown in FIG. 8.

Another embodiment of the electron beam exposure system of this invention illustrated in FIG. 8 is a combination of the system shown in FIG. 2 with the system as described by reference to FIGS. 4 to 7 of scanning electron beams so as to eliminate geometrical distortions and blurs due to aberrations of electron lenses. By reference to FIG. 8, electron beams 11 emitting from the crossover S of the electron gun 1 are focused by the first condenser electron lens 3 to form an image S'. The image S' is on the focal point of the third condenser electron lens 5, and the electron beams spreading or deflecting from the point of the image S' are acted upon by the third condenser electron lens 5 to become parallel to each other and impinge thereafter on the mask 6 vertically. As with the apparatus shown in FIG. 2, the mask 6 has a plurality of non-looped patterns 14,14' cut as shown in FIG. 3a in a simplified manner. On the plane of the image S' or in its vicinity are disposed a first deflecting coil 12 for having said electron beams select between the patterns 14 and 14' and a third deflecting coil 16 for shaping the electron beams into an adequately fine or small spot and having such spot scan on the mask 6. Selective deflection by the first deflecting coil 12 is synchronized with the scanning deflection by the third deflecting coil 16, thus cooperation of these two deflecting coils 12 and 16 causes the electron beams emitting from the position of S' to select either the cut pattern 14 or 14' in the mask 6 as well as causes a spot on parallel electron beams 15 or 15' to scan the thus selected cut pattern 14 or 14'. Pattern selection is repeated alternatively for respective sub-patterns. The parallel electron beams (either 15 or 15') passing through the mask 6 are focused by the first projector electron lens 7 to form an image of S' as S". On the plane of the image S" or in its vicinity are located a registering deflection coil 8 as well as a second deflecting coil 13 and an aberration correcting auxiliary deflection coil 17, each operating in synchronism with the first deflecting coil 12 and third deflecting coil 16 so as to combine or overlap on the projection surface or wafer 10 the cut patterns 14 and 14' that have been selectively irradiated with electron beams on the mask 6 by the first deflecting coil, and at the same time, these coils correct any geometrical distortions that occur in the exposed pattern. The second projector electron lens 9 as combined with the first projector electron lens 7 constitutes an electron projection system which forms a complete chip by projecting on the wafer 10 a reduced exposed pattern 21 that contains looped portions as shown in FIG. 3b. As described by reference to FIG. 4, blurs can be corrected by dynamic focusing that either varies part of the current flowing through the coil of the first projector electron lens 7 or the second projector electron lens 9 or adjusts the current flowing through the separate aberration correcting auxiliary focusing coil 18. Details of the method of correcting geometrical distortions and blurs in the above embodiment are now described hereinbelow.

In the arrangement of FIG. 8, let the co-ordinates of the center of the ith-pattern of a plurality of cut patterns in the mask 6 (for instance, the pattern 14 or 14' in FIG. 3a or FIG. 8) be $(a_i, b_i)$ with the electron optical axis O at the origin. Further assume that the position of an electron beam 15 or 15' on the ith-pattern has the coordinates $(x_i, y_i)$ with the center $(a_i, b_i)$ of said pattern at the origin. In such arrangement of FIG. 8, the electron orbit between the mask 6 and the image S" corresponds to $(a_i+x_i, b_i+y_i)$ as calculated for the co-ordinates with the electron optical axis O on the mask 6 at the origin, whereas the electron path between the image S" and the wafer 10 corresponds to the co-ordinates $(x_i, y_i)$ as calculated for the co-ordinates with the electron optical axis O on the mask 6 at the origin. Therefore, aberration correcting deflection signals to be applied to the aberration correcting deflection coil 17 are expressed by the following formulae (11) and (12) that replace the aforementioned formula (6) and (7), respectively:

$$\Delta x'_a = \{A_1(a_i+x_i) - B_1(b_i+y_i)\} \times \\ \{(a_i+x_i)^2 + (b_i+y_i)^2\} - (A_2x_i - B_2y_i) \\ (x_i^2 + y_i^2) \tag{11}$$

$$\Delta y'_a = \{A_1(b_i+y_i) + B_1(a_i+x_i)\} \times \\ \{(a_i+x_i)^2 + (b_i+y_i)^2\} - (A_2y_i + B_2x_i) \\ (x_i^2 + y_i^2) \tag{12}$$

These formulae differ from the formulae (6) and (7) in that even an ideal electron projection system of magnetic symmetrical doublet type described hereinbefore wherein $A_1 \approx A_2$ and $B_1 \approx B_2$ gives the right side of formula (11) or (12) the value zero.

As mentioned hereinabove, blurs can be corrected by dynamic focusing that either changes part of the current flowing through the coil of the first projector electron lens 7 or second projector electron lens 9 or changes the current flowing through the separate aberration correcting auxiliary focusing coil 18. For such dynamic focusing, the formula (8) is replaced by the following formula (13):

$$\Delta i_a' = C_1\{(a_i+x_i)^2 + (b_i+y_i)^2\} + C_2(x_i^2 + y_i^2) \tag{13}$$

For simplicity, the explanation in the embodiments of this invention described hereinbefore has assumed that all the registering deflection coil 8, first deflecting coil 12, second deflecting coil 13, third deflecting coil 16 and the aberration correcting auxiliary deflection coil 17 are independent of each other, but as illustrated in FIG. 2, 4 or 8, it should be understood that, the set of deflecting coils 12, 16 and that of deflecting coils 8, 13 and 17 may each be replaced by a common deflecting coil to which are added superimposed necessary deflection signals. The advantage of using such a common deflecting coil is complete alignment of deflection centers.

Ordinarily, one chip comprises a pattern that is exposed on an area of about $3 \times 3$ mm$^2$ on the wafer 10. As well known, the standard method of manufacturing ICs is array a number of chips on the wafer 10 which generally measures 5 to 7 cm square. Heretobefore, repeated exposure of a pattern on the wafer 10 using an electron beam exposure system has been carried out by mechanically moving an XY movable table (not shown) to which is fixed the wafer 10. However, it is inevitable that such mechanical movement of the table takes time. In a typical example, it has been found that a total of about 0.5 seconds is required for registration and movement per chip. Therefore, if the electron beam exposure system according to this invention successfully reduces the required exposure time to about 0.2 seconds per chip, the reduced time is offset by a longer time of movement. But the fact is the mechanical movement of the table has its justification because the area by which electron beams can be accurately deflected has been no more than $5 \times 5$ mm$^2$.

In the following pages, another advantage of the electron beam exposure system of this invention will be described. According to this invention, the ability of the electron beam exposure system to expose a plurality of chips simultaneously by electromagnetic deflection replaces at least part of the mechanical movement with electronic movement, thus resulting in an extreme reduction in the time for processing a chip including movement time. Reference should be made to FIG. 8 wherein a fourth deflecting means, or an arraying deflecting coil 19, is provided on the plane of S'' in addition to the registering deflection coil 8, second deflector coil 13, and aberration correcting auxiliary deflection coil 17. The arraying deflection coil 19 is used to achieve stepwise deflection per chip to thereby change the position of the chip being formed. The formulae (11), (12) and (13) are replaced with the following formulae (14), (15) and (16) to correct aberrations including one due to the deflection for arraying. By this arrangement, a plurality of chips can be electronically exposed at a time.

$$\Delta x_a'' = \{A_1(a_i+x_i) - B_1(b_i+y_i)\}\{(a_i+x_i)^2 + (b_i+y_i)^2\} - \{A_2(pj+x_i) - B_2(qj+y_i)\} \times \{(pj+x_i)^2 + (qj+y_i)^2\} \quad (14)$$

$$\Delta y_a'' = \{A_1(b_i+y_i) + B_1(a_i+x_i)\}\{(a_i+x_i)^2 + (b_i+y_i)^2\} - \{A_2(qj+y_i) + B_2(pj+x_i)\} \times \{(pj+x_i)^2 + (qj+y_i)^2\} \quad (15)$$

$$\Delta i_a'' = C_1\{(a_i+x_i)^2 + (b_i+y_i)^2\} + C_2\{(pj+x_i)^2 + (qj+y_i)^2\} \quad (16)$$

Figure 10:
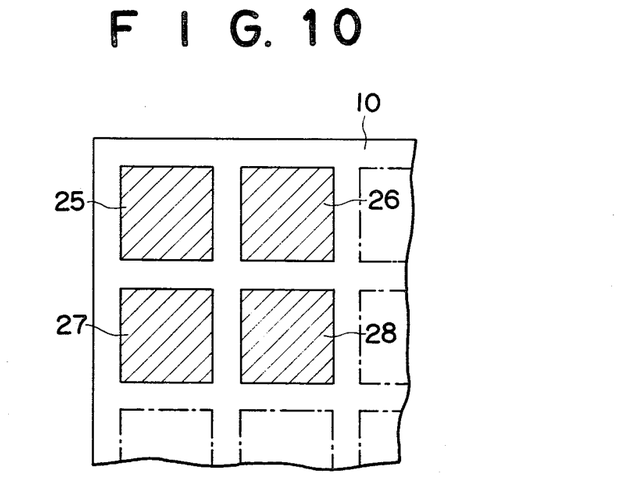
FIG. 10 shows a plurality of chips that are arrayed on the wafer by the arraying deflection coil.

In these formulae, the co-ordinates $(pj, qj)$ are those of the center of the jth-chip on the wafer 10 as calculated for the co-ordinates on the mask 6 with the electron optical axis at the origin. FIG. 10 shows four chips 25, 26, 27 and 28 as a minimum set of chips that can be electronically exposed at a time. Movement from the set of four exposed chips to another set can be achieved mechanically on the conventional XY moving table, with the time required for movement (including registration time) reduced only to about 0.1 second per chip. This is shorter than the aforementioned exposure time, for instance, 0.2 seconds (overlapping exposure takes time which as long as that required with the structure shown in FIG. 1). It should be understood that a further increase in the number of chips makes the required time of movement negligibly small. It should also be understood that the arraying deflection coil 19 as well as the coils 8, 13 and 17 may be replaced with a common single deflecting coil.

In the embodiments illustrated in FIGS. 2, 4 and 8, it is convenient to position the mask 6 just in between the third condenser electron lens 5 and the first projector electron lens 7 that are typically made of large-sized focusing coils of the same design parameters. Such arrangement offers an advantage of simple design because, if the same focusing current is passed through both coils and the image S' positioned on the focal point (to the side of electron gun) of the third condenser electron lens 5, the image S'' is formed on the focal point (to the side of projection surface) of the first projector electron lens 7 and both S' and S'' are equidistant from the mask 6, and secondly, the deflection signals for selection of sub-patterns and synthesis of sub-patterns that are to be applied to the first deflecting coil 12 and the second deflecting coil 13, respectively, have an equal level. In this connection, the deflection axes of the first deflecting coil 12 and the second deflecting coil 13 need be slanted relative to the (x, y) axis on the mask 6 by $-\phi_a$, and $+\phi_a$, respectively, $\phi_a$ being the angle of rotation of the paraxial electron trajectory produced by the focusing magnetic field from the image S' to the mask 6 (or from the mask 6 to S'').

Referring to the embodiment of this invention illustrated in FIG. 8 wherein aberrations are to be corrected by varying the current flowing through the aberration correcting auxiliary deflection coil 17 and aberration correcting auxiliary focusing coil 18, if the core or pole pieces of each coil are made of a metal, a variation in the magnetic field produces an eddy current which in turn generates an opposite magnetic field; as a result, it sometimes occurs that even correct variation of the current flowing through these two coils in compliance with the formulae (6), (7), (8); (11), (12), (13); and (14), (15), (16) does not assure the desired magnetic field for electron beams. No consideration need be given to the possibility of eddy current for the focusing coils such as the first condenser electron lens 3, third condenser electron lens 5, first projector electron lens 7 and the second projector electron lens 9 as well as the deflecting coils such as the registering deflection coil 8, first deflecting coil 12, second deflecting coil 13 and the arraying deflection coil 19 because the current flowing through these coils undergoes no variation as long as electron beams 11 are on. As for the third deflecting coil 16 that achieves scanning by deflection of electron beams, the scanning rate can safely be regarded as constant, and therefore, the variation in the magnetic field, that is, the magnitude of an opposite magnetic field due to eddy current, is constant; hence, a D. C. bias current need only be applied to the current flowing through the coil 16. However, the aberration correcting auxiliary deflection coil 17 and aberration correcting focusing coil 18 will be subject to the effect of an eddy current to an extent that cannot be neglected. Such eddy current may be eliminated by, for example, providing the current flowing through the coils with a compensating current proportional to the variation in the magnetic field. But the simplest and most reliable method is to prevent occurrence of an eddy current by composing the coil of a core or pole pieces that are made of a non-current-carrying magnetic material such as ferrite. It should be noted that pole pieces that may be exposed to the paths of electron beams need be subjected to electroless plating to render their surfaces current-carrying.

As described hereinbefore, unlike the electron beam exposure system of electron beam writing type, that of electron projecting type does not require an aperture stop to be positioned on the paths of electron beams, and therefore, a by far larger quantity of electron beams can be employed in this system. This is exactly the case with the electron beam exposure system of this invention. The arrangement of FIG. 4 or 8 that omits the second condenser electron lens 4 from FIG. 1 or 2 performs raster scanning by irradiating the entire surface of the mask 6 with electron beams whose diameter measured on the mask is by far smaller than those used in the arrangement of FIG. 1 or 2; even in such arrangement, there is no particular limitation on the width of electron beams, and so the need of an aperture stop is substantially eliminated. Hence, the fact remains that the arrangement provides by far a higher beam efficiency than the electron beam writing system. It is true that an increase in beam efficiency does not directly result in as much increase in exposure efficiency because most of the electron beams emitted from the electron gun impinge on the mask 6 and only those which penetrate the cut pattern on the mask can be used for exposure. However, the improvement in beam efficiency in the irradiated portion exceeds the reduction in exposure efficiency due to the mask 6, and so the final exposure efficiency is appreciably increased without sacrificing the resolution and accuracy in the dimensions of geometrical figures.

The embodiment illustrated in FIG. 8 of this invention provides the following performance: a resolution limit of 0.05 microns, a minimum line width of 0.25 microns, a required exposure time of 0.2 seconds per chip ($3\times3$ mm$^2$), and a geometrical distortion of 0.2 microns or less per chip. The electron exposure beam system according to this invention that is capable of easily preparing a mask having a pattern that contains looped portions and which needs only one exposure is most suitably used as a practical apparatus for processing many "submicron" miniature electronic devices. The preferred embodiments of the electron beam exposure system of this invention have hereinbefore been described in detail by reference to the accompanying drawings. In short, this invention offers the following advantages over the conventional system illustrated in FIG. 1.

(a) According to the arrangement shown in FIGS. 2 and 8, a plurality of sub-patterns cut in the mask 6 are electronically combined (or overlapped) to project the desired complete pattern on the wafer 10. Therefore, mask replacement is eliminated, only one exposure is needed, and a mask that allows exposure of the image of a pattern containing looped portions can easily be prepared. Limitations from errors in overlapping exposure can be made less strict by having the overlapped portions of sub-patterns cross with each other.

(b) According to the arrangement shown in FIGS. 4 and 8, the entire surface of the mask 6 is scanned with relatively narrow electron beams; less strict limitations on the distribution of density of electron beams that result from such arrangement allow relatively easy designing of an electron gun. Another advantage of such scanning system is that geometrical distortions or defocused spots can be minimized by applying the set of aberration correcting formulae (6), (7) and (8) or formulae (11), (12) and (13) according to the location of electron beams on the mask 6. As still another advantage, the time of movement per chip can be reduced to only a fraction of the conventionally required time since a plurality of patterns can be electronically arrayed and exposed on the wafer 10 using the formulae (14), (15) and (16) to correct aberrations.

As described hereinbefore, this invention is contemplated to exhibit extremely advantageous and extensive effects, making a great contribution to accomplishing of processing electronic devices such as ultra LSIs on an industrial scale using an electron beam exposure system of electron projecting type.

It should be understood that the description given hereinabove of the electron beam exposure system of this invention and FIGS. 2 to 10 such description is based upon are for illustrative purpose only and that they by no means limit the scope of this invention.

What I claim is:

1. An electron beam exposure system having an electron source that emits electron beams and electron lenses that focus or spread said electron beams, a mask with a pattern cut therein being irradiated with said electron beams to form an image of said cut pattern on an electron sensitive substrate to thereby form an exposed pattern on said substrate, the improvement wherein the cut pattern in the mask comprises a plurality of sub-patterns that make up the exposed pattern, and the system further comprises a first deflecting means for having the electron beams sequentially select sub-patterns in the mask, and a second deflecting means that in synchronism with said first deflecting means combine the sub-patterns in said mask irradiated with said electron beams to thereby form a complete image of said exposed pattern on said substrate.

2. An electron beam exposure system according to claim 1 wherein the electron beams with which the cut pattern in the mask is irradiated have a cross section sufficiently large to encompass each sub-pattern cut in said mask.

3. An electron beam exposure system having an electron source that emits electron beams and electron lenses that focus or spread said electron beams, a mask with a pattern cut therein being irradiated with said electron beams to form an image of said cut pattern on an electron sensitive substrate to thereby form an exposed pattern on said substrate, the improvement wherein the cut pattern in the mask comprises a plurality of sub-patterns that make up the exposed pattern and the system further comprises a first deflecting means for having the electron beams sequentially select sub-patterns in the mask, a third deflecting means for shaping the electron beams with which said mask is to be irradiated into electron beams having a cross section adequately smaller than each sub-pattern in the mask and for having such electron beams scan the selected sub-patterns in the mask, and a second deflecting means that in synchronism with said first and third deflecting means combine the sub-patterns in said mask irradiated with said electron beams to thereby form a complete image of said exposed pattern on said substrate.

4. An electron beam exposure system having an electron source that emits electron beams and electron lenses that focus or spread said electron beams, a mask with a pattern cut therein being irradiated with said electron beams to form an image of said cut pattern on an electron sensitive substrate to thereby form an exposed pattern on said substrate, the improvement wherein the cut pattern in the mask comprises a plurality of sub-patterns that make up the exposed pattern and the system further comprises a first deflecting means having the electron beams sequentially select sub-patterns in the mask, a third deflecting means for shaping the electron beams with which said mask is to be irradiated into electron beams having a cross section adequately smaller than each sub-pattern in the mask and for having such electron beams scan the selected sub-patterns in the mask, a second deflecting means that in synchronism with said first and third deflecting means combine the sub-patterns in said mask irradiated with said electron beams to thereby form a complete image of said exposed pattern on said substrate, and a fourth deflecting means for arraying and exposing a plurality of complete images of said exposed pattern on said substrate.

5. An electron beam exposure system according to claim 3 or 4 wherein the system further has a fifth deflecting means that, in synchronism with said first and third deflecting means, deflects the electron beams deflected by said first and third deflecting means for correcting geometrical distortions relative to the position where said electron beams impinge on said mask.

6. An electron beam exposure system according to claim 5 wherein said fifth deflecting means is integral with said first or third deflecting means.

7. An electron beam exposure system according to claim 3 or 4 wherein said electron lenses for imaging the cut pattern in the mask on said substrate include an electron lens that, in synchronism with said first and third deflecting means, performs dynamic focusing of the electron beams deflected by said first and third deflecting means for correcting blurs relative to the position where said electron beams impinge on said mask.

8. An electron beam exposure system according to claim 7 wherein said electron lens for effecting dynamic focusing for correcting blurs is integral with said electron lens for imaging the cut pattern in the mask on said substrate.

9. An electron beam exposure system according to claim 3 or 4 wherein said first and third deflecting means are integral.

10. An electron beam exposure system according to any of claims 3 or 4 wherein said electron beams for scanning the cut pattern have a cross section wide enough to overlap with each other on the mask.

11. An electron beam exposure system according to any of claims 1 to 4 wherein said cut pattern in the mask comprises a plurality of sub-patterns that make up said exposed pattern, none of such sub-patterns containing looped portions.

12. An electron beam exposure system according to any of claims 1 to 4 wherein said sub-patterns in the mask are so formed that when images of said sub-patterns are combined together on said substrate, they cross with each other and protrude some distance at the junctions of the respective sub-patterns.

* * * * *